(12) United States Patent
Hosseini et al.

(10) Patent No.: US 8,598,694 B2
(45) Date of Patent: Dec. 3, 2013

(54) CHIP-PACKAGE HAVING A CAVITY AND A MANUFACTURING METHOD THEREOF

(75) Inventors: Khalil Hosseini, Weihmichl (DE); Joachim Mahler, Regensburg (DE); Anton Prueckl, Schierling (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/301,823

(22) Filed: Nov. 22, 2011

(65) Prior Publication Data

US 2013/0127031 A1 May 23, 2013

(51) Int. Cl.
*H01L 23/495* (2006.01)
*H01L 21/768* (2006.01)

(52) U.S. Cl.
USPC ............ 257/676; 257/E23.052; 257/E21.575; 257/685; 257/686; 257/723; 257/724; 257/728; 257/777; 257/675; 257/666; 257/668

(58) Field of Classification Search
USPC ......... 257/676, 685, 686, 723, 724, 728, 777, 257/675, 666, 668, E21.575, E23.052
See application file for complete search history.

(56) References Cited

U.S. PATENT DOCUMENTS

| | | | |
|---|---|---|---|
| 2004/0188834 A1* | 9/2004 | Konishi et al. | 257/734 |
| 2004/0188854 A1* | 9/2004 | Konishi et al. | 257/777 |
| 2005/0117271 A1* | 6/2005 | De Samber et al. | 361/306.1 |
| 2006/0113562 A1* | 6/2006 | Jeun et al. | 257/177 |
| 2007/0099343 A1* | 5/2007 | Pavier | 438/106 |
| 2007/0132112 A1* | 6/2007 | Ozaki et al. | 257/787 |
| 2008/0105894 A1* | 5/2008 | Ishidu et al. | 257/100 |
| 2008/0224285 A1* | 9/2008 | Lim et al. | 257/675 |
| 2008/0302564 A1* | 12/2008 | Olson et al. | 174/268 |
| 2009/0001535 A1* | 1/2009 | Heng et al. | 257/676 |
| 2012/0146177 A1* | 6/2012 | Choi et al. | 257/528 |

* cited by examiner

*Primary Examiner* — A O Williams

(57) ABSTRACT

Various embodiments provide a chip-carrier including, a chip-carrier surface configured to carry a first chip from a first chip bottom side, wherein a first chip top side of the first chip is configured above the chip-carrier surface; and at least one cavity extending into the chip-carrier from the chip-carrier surface; wherein the at least one cavity is configured to carry a second chip from a second chip bottom side, wherein a second chip top side of the second chip is substantially level with the first chip top side. The second chip is electrically insulated from the chip-carrier by an electrical insulation material inside the cavity.

24 Claims, 8 Drawing Sheets

FIG 5

~ 500 forming a chip-carrier surface, wherein the chip-carrier surface is configured to carry a first chip from a first chip bottom side, wherein a first chip top side of the first chip is configured above the chip-carrier surface ~ 510 and forming at least one cavity extending into the chip-carrier from the chip-carrier surface; wherein the at least one cavity is configured to carry a second chip from a second chip bottom side, wherein a second chip top side of the second chip is substantially level with the first chip top side; and ~ 520 forming an isolation material over the chip-carrier surface for isolating the first chip, the second chip and the chip-carrier. ~ 530

CHIP-PACKAGE HAVING A CAVITY AND A MANUFACTURING METHOD THEREOF

TECHNICAL FIELD

Various embodiments relate generally to a chip-carrier, a method for forming a chip-carrier and a method for forming a chip package.

BACKGROUND

After semiconductor chips are fabricated, individual chips may be attached to a leadframe. During the construction of one or more chips on a leadframe, the different thicknesses of chips often create a problem for subsequent processes. This is especially so because with the attachment of chips to a leadframe, both electrical conduction of chips as well as electrical isolation of chips need to be achieved.

The continual problem of constructing chips of different thickness onto a chip-carrier, e.g. a leadframe, has been an accepted processing difficulty.

SUMMARY

Various embodiments provide a chip-carrier including, a chip-carrier surface configured to carry a first chip from a first chip bottom side, wherein a first chip top side of the first chip is configured above the chip-carrier surface; and at least one cavity extending into the chip-carrier from the chip-carrier surface; wherein the at least one cavity is configured to carry a second chip from a second chip bottom side, wherein a second chip top side of the second chip is substantially level with the first chip top side.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5 shows a method for forming a chip package according to an embodiment.

DETAILED DESCRIPTION

Figure 1A:
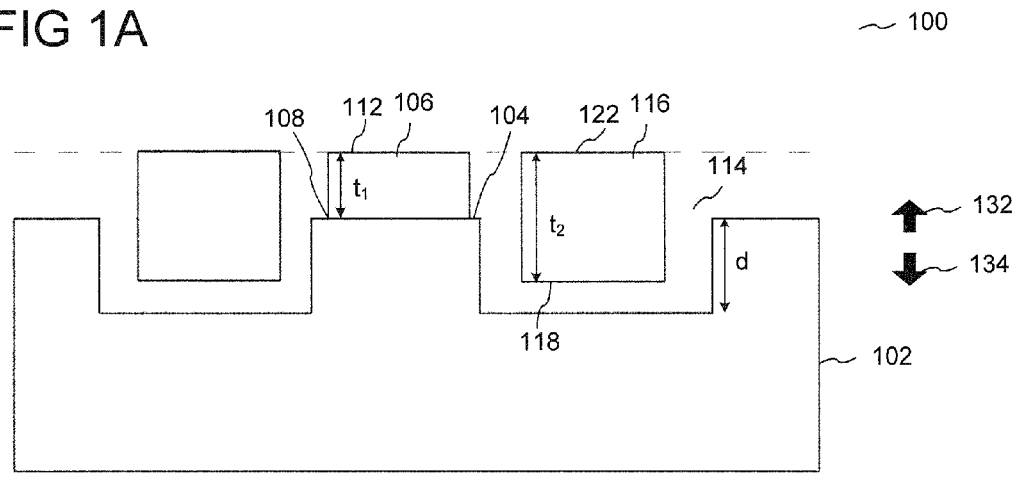
FIG. 1A shows a chip-carrier according to an embodiment.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Various embodiments address the problem of how to construct chips of different thickness onto a chip-carrier, e.g. a leadframe.

Various embodiments provide a leadframe for carrying one or more chips, wherein the leadframe is configured such that chips of different heights being carried by the leadframe may be substantially level with each other.

Integrating one or more chips onto a leadframe is challenging, e.g. when power semiconductor chips and logic chips have to be integrated onto the same leadframe. Power semiconductor chips may be generally thin, e.g. having a thickness of less than 60 µm. Logic control chips may be generally thicker than power semiconductor chips, e.g. having a thickness of larger than 100 µm. Currently, logic control chips have to be thinned down, to be integrated with power semiconductor chips.

For example, one or more MOSFET chips may be attached, e.g. soldered, e.g. bonded, to a leadframe. The one or more MOSFET chips may be attached such that they are bonded via an electrically conductive connection e.g. an electrically conductive glue, e.g. an electrically conductive adhesive, e.g. an electrically conductive solder, to a leadframe.

For example, one or more logic control chips may be attached, e.g. glued, e.g. bonded, to the same leadframe, using isolating glue. The one or more MOSFET chips may be arranged next to each other over a leadframe side. The logic control chip may be thinned down to the thickness of the MOSFET chips. The thinning of the logic control chips down to 60 µm or less, creates substantial problems due to cracks and fractures in the wafer, e.g. in silicon wafers, depending on the composition of the basis material of the wafer. Difficulties encountered with adhesive glue, e.g. adhesive acceleration in thinner chips, lead to the limiting of chip yield, and incur high costs. A particularly serious problem is encountered with paste accelerator in thin chips. The process of electrically isolating connections in thin chips, e.g. chips thinner than 100 µm and subsequent processes are challenging processing steps. Other processes, such as lamination and via formation, are affected by the use of a thicker logic control chip, i.e. e.g. chips thicker than 100 µm. It is therefore important that after bonding processes, the top side of the control chip lies on the same level as the top sides of the two MOSFET chips.

FIG. 1A shows chip-carrier 102 according to an embodiment. Chip-carrier 102 may include chip-carrier surface 104 configured to carry first chip 106 from first chip bottom side 108, wherein first chip top side 112 of first chip 106 may be configured above chip-carrier surface 104; and at least one cavity 114 extending into chip-carrier 102 from chip-carrier surface 104; wherein at least one cavity 114 may be configured to carry second chip 116 from second chip bottom side 118, wherein second chip top side 122 of second chip 116 may be substantially level with first chip top side 112.

First chip top side 112 may be configured to face direction 132 opposite to direction 134 which first chip bottom side 108 faces.

Second chip top side 122 may be configured to face direction 132 opposite to direction 134 which second chip bottom side 118 faces.

A distance from first chip bottom side 108 to first chip top side 112 defines first chip thickness $t_1$. A distance from second chip bottom side 118 to second chip top side 122 defines second chip thickness $t_2$. Second chip thickness $t_2$ may be larger than first chip thickness $t_1$.

First chip thickness $t_1$ may range from about 20 µm to about 150 µm, e.g. about 20 µm to about 80 µm, e.g. about 40 µm to about 60 µm.

Second chip thickness $t_2$ may range from about 100 µm to about 300 µm, e.g. about 120 µm to about 250 µm, e.g. about 150 µm to about 200 µm.

A depth d of at least one cavity 114 extending into chip-carrier 102 from chip-carrier surface 104 may be approximately equal to or more than a difference between second chip thickness $t_2$ and first chip thickness $t_1$.

Therefore, depth d of at least one cavity 114 extending into chip-carrier 102 may range from about 0 µm to about 290 µm, e.g. about 25 µm to about 125 µm, e.g. about 50 µm to about 100 µm from chip-carrier surface 104.

Second chip top side 122 of second chip 116 may be substantially level with first chip top side 112. wherein the difference between the levels of second chip top side 122 and first chip top side 112 may range from about 0 µm to about 20 µm, e.g. from about 0 µm to about 5 µm, e.g. from about 0 µm to about 3 µm.

Figure 1B:
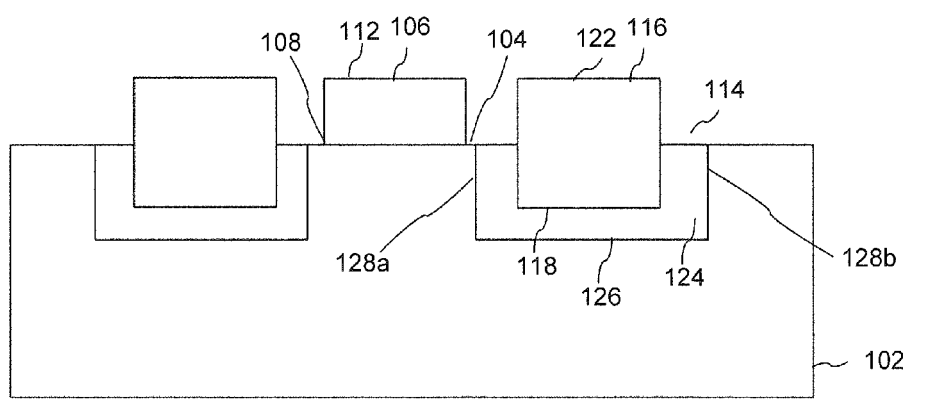
FIG. 1B shows a chip-carrier according to an embodiment.

FIG. 1B shows chip-carrier 102 according to an embodiment, wherein chip-carrier 102, as described according to FIG. 1A, may include adhesive material 124 formed over bottom side of cavity 126, wherein second chip 116 may be formed over adhesive material 124.

Second chip bottom side 118 may be adhered to bottom side of cavity 126 via adhesive material 124.

First chip bottom side 108 may be adhered to chip-carrier 102, wherein first chip bottom side 108 is in electrical connection with chip-carrier 102. For example, first chip bottom side 108 may be attached to chip-carrier 102 by means of an electrically conductive adhesive, e.g. an electrically conductive glue, e.g. an electrically conductive solder, e.g. an electrically conductive paste.

Adhesive material 124 may be further configured to electrically isolate, i.e. electrically insulate, second chip 116 from one or more sides 128a, 128b of cavity 114.

Adhesive material 124 may be configured to electrically isolate second chip 116 from bottom side of cavity 126.

Adhesive material 124 may serve as an adhesive, as well as an embedding material for chips, e.g. second chip 116.

First chip 106 may include a power semiconductor device, wherein the power semiconductor device may include at least one power semiconductor device from the group consisting of: a power transistor, a power MOS transistor, a power bipolar transistor, a power field effect transistor, a power insulated gate bipolar transistor IGBT, a thyristor, a MOS controlled thyristors, a silicon controlled rectifier, a power schottky diode, a silicon carbide diode, a gallium nitride device.

Second chip 116 may include a semiconductor logic device, wherein the semiconductor logic device or memory device may include at least one semiconductor logic device or memory device from the group consisting of: an ASIC, a driver, a controller, a sensor.

Chip-carrier 102 may be configured to be in electrical connection with first chip bottom side 108.

First chip 106 and second chip 116 may include a power-logic integrated circuit, the power-logic integrated circuit including a power semiconductor device and a semiconductor logic device.

Chip-carrier 102 may include a leadframe.

Chip-carrier 102 may include at least one from the following group of materials, the group of materials consisting of: copper, nickel, iron, copper alloy, nickel alloy, iron alloy, aluminum and aluminum alloy.

Chip-carrier 102 may include part of a leadframe, e.g. an electrically conductive leadframe. Chip-carrier 102 may be configured to be in electrical connection with first chip bottom side 108. Chip-carrier 102 may be arranged to be connected to a printed circuit board. Chip-carrier 102 may be arranged to be connected to a heat sink.

First chip bottom side 108 may include at least part of a source/drain contact of a power device, e.g. a source/drain contact of a power transistor, e.g. a drain contact of power semiconductor MOSFET, e.g. a collector contact of a power semiconductor IGBT.

First chip top side 112 may include at least part of a source/drain contact of a power device, e.g. a source/drain contact of a power transistor, e.g. a source contact of power semiconductor MOSFET, e.g. a emitter contact of a power semiconductor IGBT. Therefore, first chip top side 112 may include one or more electrical contacts formed over first chip top side 112. One or more electrical contacts formed over first chip top side 112, may include a source/drain contact of a power device. One or more electrical contacts formed over first chip top side 112, may include a gate of a power device, Second chip top side 122 may includes one or more electrical contacts formed over second chip top side 122. One or more electrical contacts formed over second chip top side 122 may include a source/drain contact of a logic control device, e.g. a logic control transistor. One or more electrical contacts formed over second chip top side 122 may include a gate contact of a logic control device, e.g. a logic control transistor.

Chip-carrier 102 may include chip-carrier surface 104 configured to carry first chip 106 wherein first chip 106 is configured to be in electrical connection with chip-carrier surface 104; and at least one cavity 114 extending into chip-carrier 102 from chip-carrier surface 104; wherein at least one cavity 114 is configured to carry second chip 116 wherein the second chip 116 is electrically insulated from the chip-carrier 102.

Due to chip-carrier 102, one or more electrical contacts formed over first chip top side 112 and one or more electrical contacts formed over second chip top side 122 may be substantially level with each other. Therefore, a housing for chips with different thicknesses may be built, circumventing the problems and challenges, such as thinning, wafer acceleration, wafer cracking, as described above.

Figure 2A:
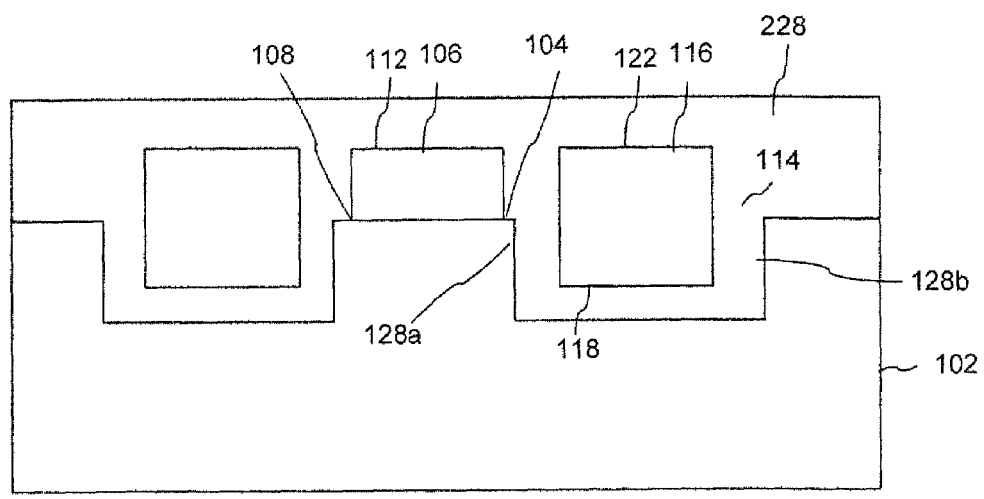
FIG. 2A shows a chip package according to an embodiment.

FIG. 2A shows chip package 200 according to an embodiment. Chip package 200 may include chip-carrier 102 already described above with respect to FIGS. 1A and 1B. Like reference numerals already used with respect to chip-carrier 102 generally refer to the same parts in chip-package 200.

Chip-carrier 102 may include chip-carrier surface 104 configured to carry first chip 106 from first chip bottom side 108, wherein first chip top side 112 of first chip 106 may be configured above chip-carrier surface 104; and at least one cavity 114 extending into chip-carrier 102 from chip-carrier surface 104; wherein at least one cavity 114 may be configured to carry second chip 116 from second chip bottom side 118, wherein second chip top side 122 of second chip 116 may be substantially level with first chip top side 112; and isolation material 228 formed over chip-carrier surface 104, wherein isolation material 228 may be configured to isolate first chip 106, second chip 116 and chip-carrier 102.

Isolation material 228 may be configured to surround second chip 116 on one or more sides of second chip 116.

Isolation material 228 may be configured to surround first chip 106 on one or more sides of first chip 106.

Isolation material 228 may be configured to electrically isolate second chip 116 from one or more sides 128a, 128b of cavity 114.

Isolation material 228 may be configured to electrically isolate one or more electrical contacts formed over first chip top side 112.

Isolation material 228 may be configured to electrically isolate one or more electrical contacts formed over second chip top side 122.

Isolation material 228 may include at least one material from following group of materials, the group consisting of: filled or unfilled epoxy, pre-impregnated composite fibers, laminate, a mold material, a thermoset material, a thermoplastic material.

Figure 2B:
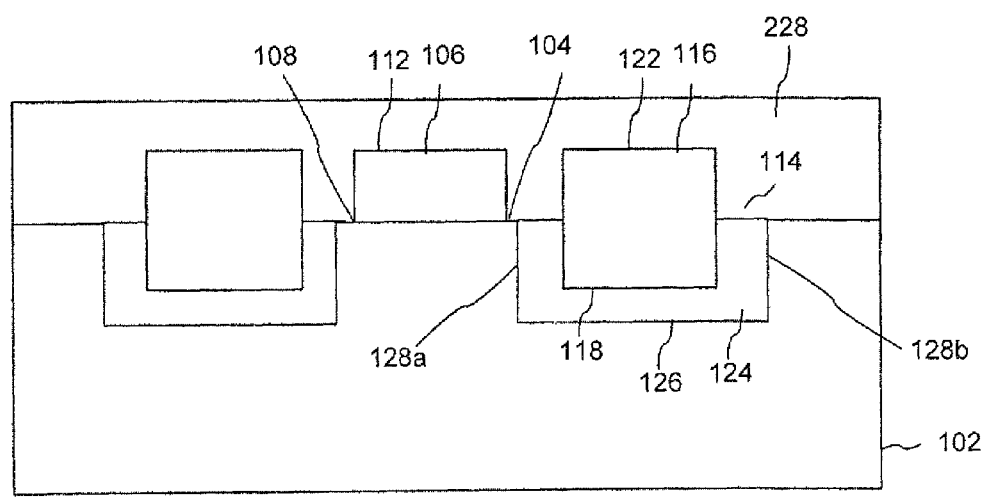
FIG. 2B shows a chip package according to an embodiment.

FIG. 2B shows chip-package 200 according to an embodiment, wherein chip-package 210 may include chip package 200 described according to FIG. 2A and further adhesive material 124 formed over bottom side of cavity 126, wherein adhesive material 124 may be further configured to electrically isolate second chip 116 from one or more sides 128a, 128b of cavity 114.

Adhesive material 124 may be configured to adhere second chip bottom side 118 to bottom side of cavity 126.

Adhesive material 124 may be configured to electrically isolate second chip 116 from bottom side of cavity 126.

Chip-carrier 102 may include adhesive material 124 formed over bottom side of cavity 126, wherein second chip 116 may be formed over adhesive material 124.

Adhesive material 124 formed over bottom side of cavity 126 may have a thickness ranging from between about 1 μm to about 100 μm, e.g. from about 10 μm to about 60 μm, e.g. from about 25 μm to about 50 μm.

Second chip bottom side 118 may be adhered to bottom side of cavity 126 via adhesive material 124.

Adhesive material 124 may be further configured to electrically isolate second chip 116 from one or more sides of cavity 128a, 128b.

First chip 106 may include a power semiconductor device, wherein the power semiconductor device may include at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

Second chip 116 may include a semiconductor logic device or memory device, wherein the semiconductor logic device or memory device may include at least one semiconductor logic device or memory device from the group consisting of: an ASIC, a driver, a controller, a sensor.

Chip-carrier 102 may be configured to be in electrical connection with first chip bottom side 108.

First chip 108 and second chip 118 may include a power-logic integrated circuit, the power-logic integrated circuit including a power semiconductor device and a semiconductor logic device.

Chip-carrier 102 may include a leadframe.

Chip-carrier 102 may include at least one from the following group of materials, the group of materials consisting of: copper, nickel, iron, copper alloy, nickel alloy, iron alloy, aluminum and aluminum alloy.

Chip-carrier 102 may include chip-carrier surface 104 configured to carry first chip 106 wherein first chip 106 is configured to be in electrical connection with chip-carrier surface 104; and at least one cavity 114 extending into chip-carrier 102 from chip-carrier surface 104; wherein at least one cavity 114 is configured to carry second chip 116 wherein the second chip 116 is electrically insulated from the chip-carrier 102.

Figure 3:
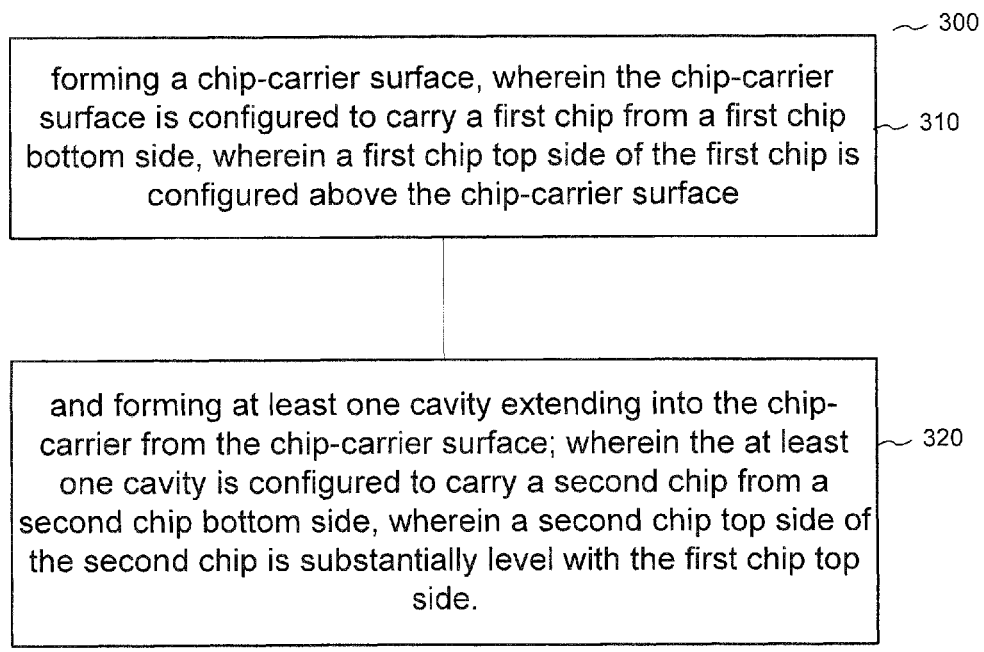
FIG. 3 shows a method for forming a chip-carrier according to an embodiment.

FIG. 3 shows method 300 for forming a chip-carrier 102 according to an embodiment. The method includes forming a chip-carrier surface for carrying a first chip from a first chip bottom side, wherein a first chip top side of the first chip may be configured above the chip-carrier surface (in 310); and forming at least one cavity extending into the chip-carrier from the chip-carrier surface; wherein the at least one cavity may be for carrying a second chip from a second chip bottom side, wherein a second chip top side of the second chip may be substantially level with the first chip top side (in 320).

FIGS. 4A to 4E show method 400 for forming chip-carrier 102 according to various embodiments. All the features described with respect to forming chip-carrier 102 are applicable to chip-carrier 102 and chip package 200. Like reference numerals already used with respect to chip-carrier 102 generally refer to the same parts in chip-package 200.

Figure 4A:
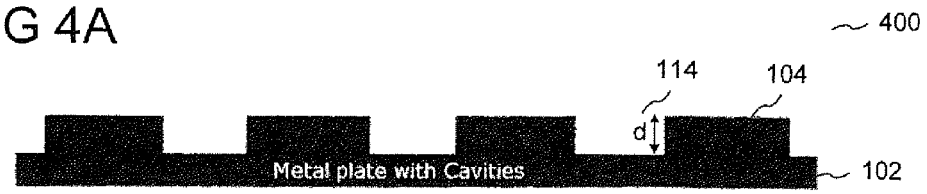
FIGS. 4A to 4E show a method for forming a chip-carrier according to an embodiment.

In FIG. 4A, one or more cavities 114 extending into chip-carrier 102 from a chip-carrier surface 104 may be formed in chip carrier surface 104. One or more cavities 114 may be formed by an etching process. One or more cavities 114 may be formed by a laser removal process. One or more cavities 114 may be formed by removing one or more portions from chip-carrier surface 104.

A distance from first chip bottom side 108 to first chip top side 112 defines first chip thickness $t_1$. First chip thickness $t_1$ ranges from about 50 μm to about 60 μm. A distance from second chip bottom side 118 to second chip top side 122 defines second chip thickness $t_2$. Second chip thickness $t_2$ may be larger than first chip thickness $t_1$. Second chip thickness $t_2$ ranges from about 100 μm to about 300 μm. As first chip thickness $t_1$ and second chip thickness $t_2$ may be known, depth d of at least one cavity 114 extending into chip-carrier 102 from chip-carrier surface 104 may be approximately equal to or more than a difference between second chip thickness $t_2$ and first chip thickness $t_1$.

Depth d of at least one cavity 114 extending into chip-carrier 102 from chip-carrier surface 104 may be about 100 μm to about 400 μm, e.g. about 150 μm to about 350 μm, e.g. about 200 μm to about 300 μm, more than the difference between second chip thickness $t_2$ and first chip thickness $t_1$.

For example, second chip 116, e.g. a logic integrated circuit chip, may have a second chip thickness $t_2$ of 220 μm; first chip 106, e.g. a power semiconductor chip, may have a second chip thickness $t_2$ of about 60 μm; depth d of at least one cavity 114 may be about 160 μm to 200 μm.

Figure 4B:
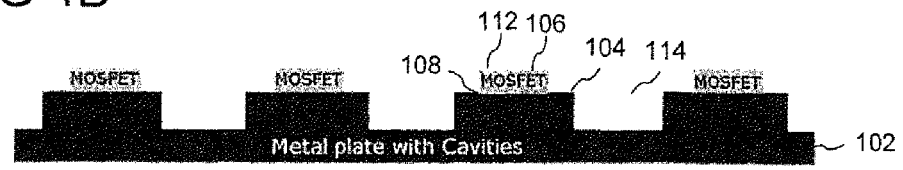

In FIG. 4B, chip-carrier surface 104 may be configured to carry first chip 106 from a first chip bottom side 108. First chip 106 may be adhered to chip-carrier surface 104 using an adhesive paste, e.g. glue. First chip 106 may be adhered to chip-carrier surface 104 via first chip bottom side 108. First chip 106 may be adhered to chip-carrier surface 104 via first chip bottom side 108. First chip 106 may be in electrical connection with chip-carrier surface 104 via first chip bottom side 108. First chip top side 112 of first chip 106 may be configured above chip-carrier surface 104. A cohesive die attach may be formed between first chip 106 and chip-carrier surface 104.

Figure 4C:
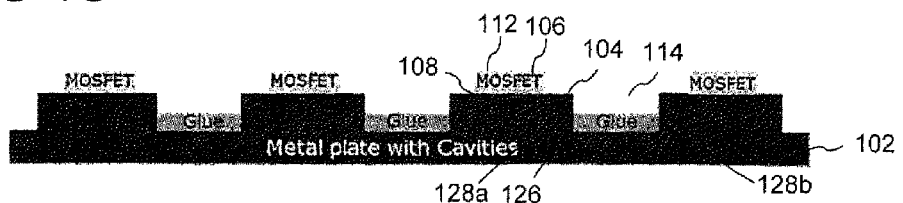

In FIG. 4C, adhesive material 124 may be deposited within cavity 114. Adhesive material 124 may be formed over bottom side of cavity 126.

Adhesive material 124 may be deposited into cavity 114 using a dispenser. Adhesive material 124 may be deposited within cavity 114 using a printing process.

Figure 4D:
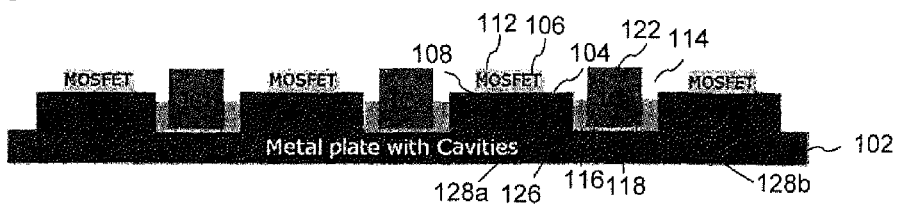

In FIG. 4D, second chip 116 may be arranged over adhesive material 124. In order to secure second chip 116 in cavity 114, second chip 116 may first be held within cavity 114 by an external support, such that second chip top side 122 and first chip top side 122 may be level. Following which, adhesive material 124 may be deposited within cavity 114, such that second chip 116 may be arranged over adhesive material 124, thereby adhering second chip 116 to bottom side of cavity 126 via adhesive material 124.

Adhesive material 124 may fill spaces between lateral sides of second chip 116 and sidewalls 128a, 128b of cavity 114. The lateral sides of second chip 116 may refer to the sides of second chip 116 extending between second chip top side 122 and second chip bottom side 118. Cavity 114 may be structured to ensure that sufficient space remains between the lateral sides of second chip 116 and sidewalls 128a, 128b. Lateral sides of second chip 116 may be separated from side walls 128a, 128b by a distance of about 10 μm to about 50 μm, e.g. about 15 μm to about 40 μm, e.g. about 20 μm to about 30 μm, With sufficient adhesive material 124, between the lateral sides of second chip 116 and side walls 128a, 128b, adhesive material 124, which may function as an insulation material, ensures that embedded second chip 116 may be well electrically isolated, even though second chip top side 122 may be not yet electrically insulated.

Adhesive material 124 may be cured, e.g. thermally cured, to form a stable embedding material.

As shown in FIG. 4D, adhesive material 124 may be deposited such that adhesive material 124 lies within cavity 114. In other words, such that the level of adhesive material 124 does not exceed that of chip surface 104, e.g. adhesive material 124 may be deposited to have a height of about 10 μm to about 50 μm, e.g. about 15 μm to about 40 μm, e.g. about 20 μm to about 30 μm, from bottom side of cavity 126. Adhesive material 124 may be further configured to electrically isolate second chip 116 from one or more sides 128a, 128b of cavity 114.

Figure 4E:
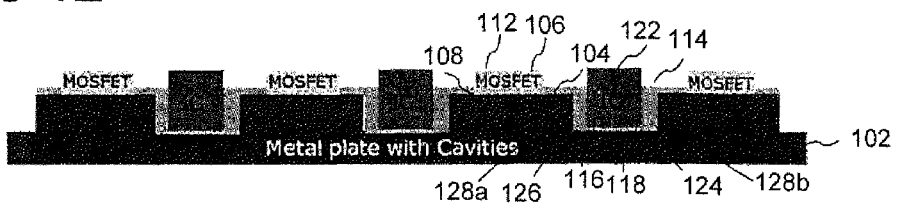

According to an alternative embodiment shown in FIG. 4E, adhesive material 124 may be deposited such that adhesive material 124 overflows cavity 114. In other words, such that the level of adhesive material 124 exceeds that of chip surface 104, i.e. the level of adhesive material 124 is higher than that of chip surface 104. Adhesive material 124 may surround one or more sides of first chip 106.

As such, at least one cavity 114 may be configured an embedded second chip 116 from second chip bottom side 118, such that second chip top side 122 of second chip 116 may be substantially level with first chip top side 112.

FIG. 5 shows method 500 for forming a chip package 200, 210 according to an embodiment. The method includes:

forming a chip-carrier surface for carrying a first chip from a first chip bottom side, wherein a first chip top side of the first chip may be configured above the chip-carrier surface (in 510);

forming at least one cavity extending into the chip-carrier from the chip-carrier surface; wherein the at least one cavity may be for carrying a second chip from a second chip bottom side, wherein a second chip top side of the second chip may be substantially level with the first chip top side (in 520); and forming an isolation material over the chip-carrier surface for partially surrounding the first chip, the second chip and the chip-carrier (in 530).

FIGS. 6A to 6E show method 600 for forming a chip package 200, 210 according to an embodiment. All the features described with respect to forming chip-carrier 102 as described according to method 300, and in FIGS. 3 and 4A to 4G, are applicable to chip package 200 and chip package 210. Like reference numerals already used with respect to chip-carrier 102 generally refer to the same parts in chip package 200 and chip package 210.

Figure 6A:
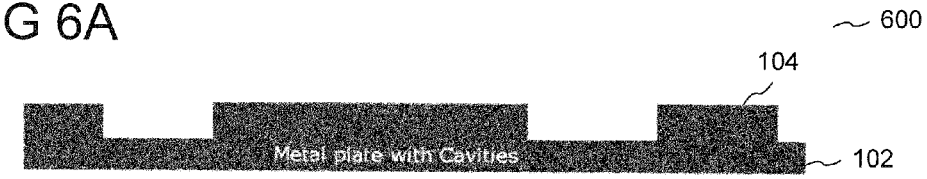
FIGS. 6A to 6G show methods for forming a chip package according to various embodiments.
Figure 6B:
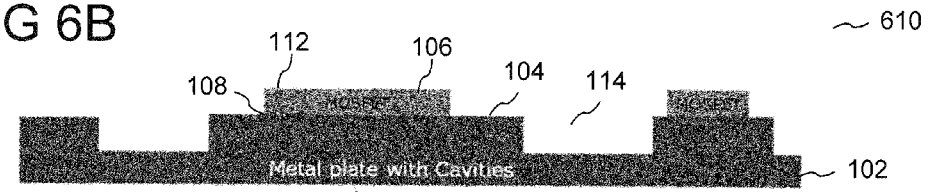
Figure 6C:
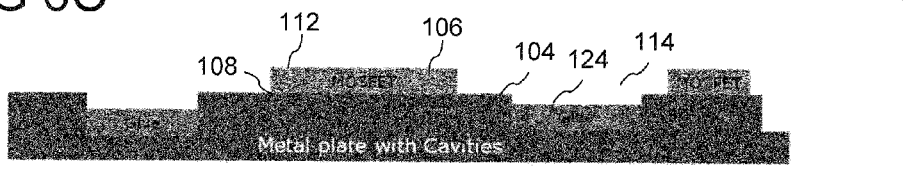

The process method as shown in FIGS. 6A to 6C may be carried out as described in FIGS. 4A to 4C above. One or more cavities 114 extending into chip-carrier 102 from chip-carrier surface 104 may be formed in chip carrier surface 104, as described according to FIG. 4A. Chip-carrier surface 104 may be configured to carry first chip 106 from first chip bottom side 108, as described according to FIG. 4B. Adhesive material 124 may be deposited within cavity 114. Adhesive material 124 may be formed over bottom side of cavity 126, as described according to FIG. 4C.

Figure 6D:
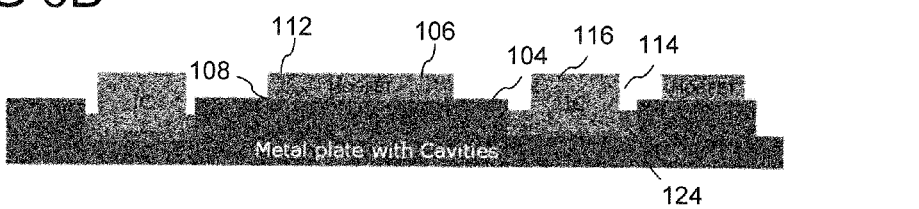

In FIG. 6D, second chip 116 may be arranged over adhesive material 124, as described according to FIG. 4D. Adhesive material 124 may be further configured to electrically isolate second chip 116 from one or more sides 128a, 128b of cavity 114.

Electrical connections may be made to one or more electrical contacts formed on second chip top side 122. Electrical connections may be made to one or more electrical contacts formed on first chip top side 112.

The components, e.g. first chip 106, second chip 116, may then be encapsulated.

Figure 6E:
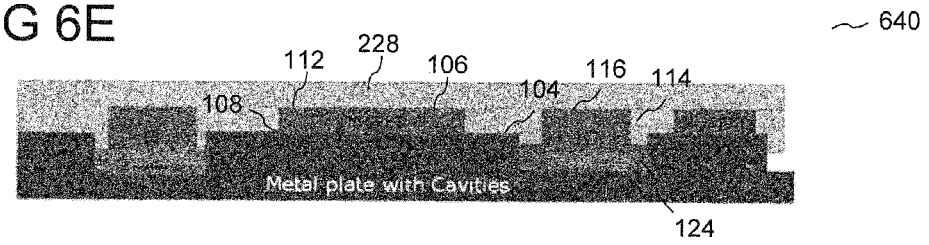

If adhesive material 124 may be deposited such that adhesive material 124 lies within cavity 114, as shown in FIG. 4D and FIG. 6D, in other words, such that the level of adhesive material 124 does not exceed that of chip surface 104, then isolation material 228 may be configured to surround second chip 116 on one or more sides of second chip 116, within cavity 114, such as is shown in FIG. 6E.

In FIG. 6E, isolation material 228 may be deposited over chip-carrier surface 104. Isolation material 224 may be for partially surrounding first chip 106, second chip 116 and chip-carrier 102. Isolation material 224 may be for filling gaps, e.g. gaps between first chip 106 and second chip 108, gaps between second chip 106 and one or more sides 128a, 128b of cavity. Isolation material 228 may be configured to surround second chip 116 on one or more sides of second chip 116. Isolation material 228 may be configured to surround first chip 106 on one or more sides of first chip 106. Isolation material 228 may be configured to electrically isolate second chip 116 from one or more sides 128a, 128b of cavity 114. Isolation material 228 may be configured to electrically isolate one or more electrical contacts formed over first chip top side. Isolation material 228 may be configured to electrically isolate one or more electrical contacts formed over second chip top side.

Figure 6F:
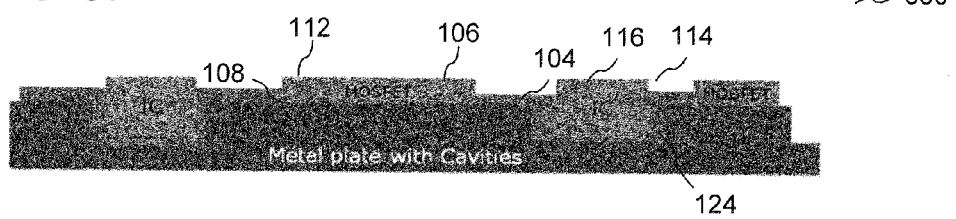
Figure 6G:
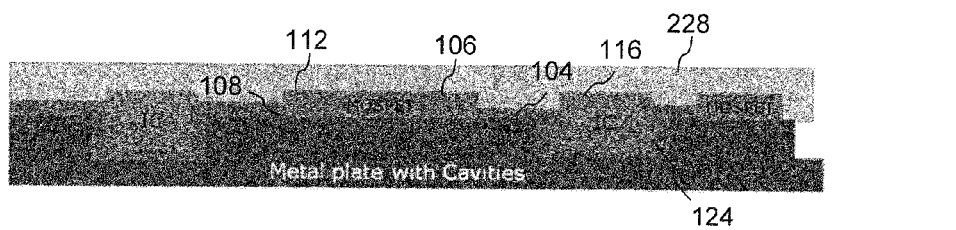

FIGS. 6F and 6G show an alternative process for the deposition of isolation material 228 in the case where adhesive material 124 may be deposited such adhesive material 124 overflows cavity 114 as shown in FIG. 4E and FIG. 6F. Second chip 116 may be arranged over adhesive material 124, as described according to FIG. 4E. If adhesive material 124 may be deposited such adhesive material 124 overflows cavity 114 as shown in FIG. 4E and FIG. 6F, in other words, such that the level of adhesive material 124 exceeds that of chip surface 104, then isolation material 228 may be configured to surround second chip 116 on one or more sides of second chip 116. Isolation material 228 may be formed over adhesive material 124, wherein adhesive material 124 may be formed over chip-carrier surface 104 as shown in FIG. 6G.

In FIG. 6G, isolation material 228 may be deposited over chip-carrier surface 104. Isolation material 224 may be for partially surrounding first chip 106, second chip 116 and chip-carrier 102. Isolation material 224 may be for filling gaps, e.g. gaps between first chip 106 and second chip 108. Isolation material 228 may be configured to surround second chip 116 on one or more sides of second chip 116. Isolation material 228 may be configured to surround first chip 106 on one or more sides of first chip 106. Isolation material 228 may be configured to electrically isolate one or more electrical contacts formed over first chip top side. Isolation material 228 may be configured to electrically isolate one or more electrical contacts formed over second chip top side.

Figure 7:
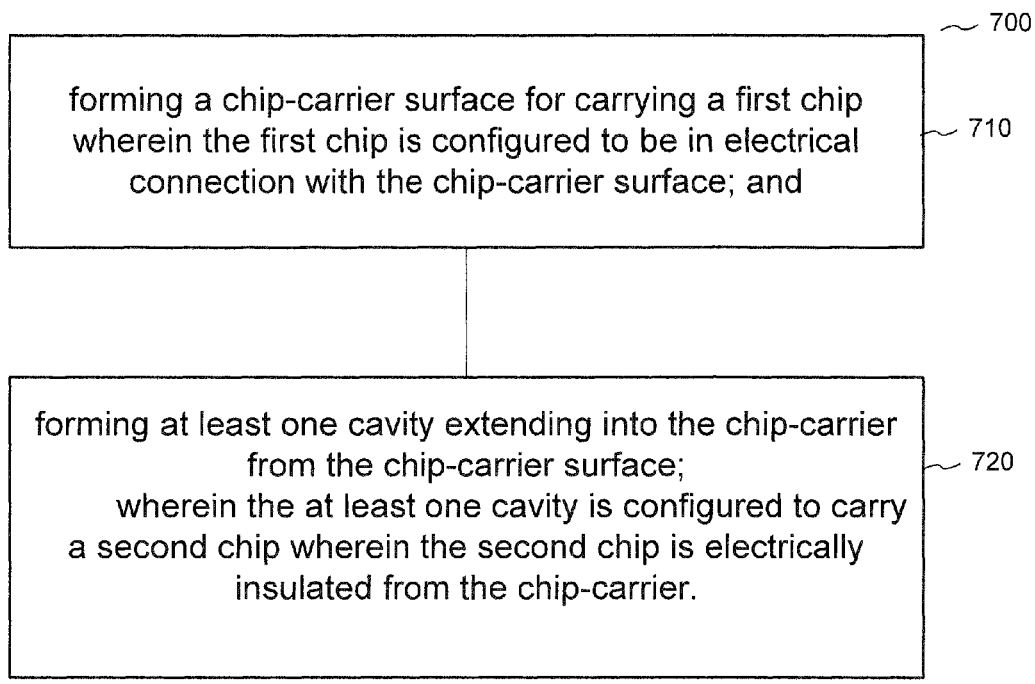
FIG. 7 show a method for forming a chip-carrier according to an embodiment.

FIG. 7 shows a method for forming chip-carrier 102 according to an embodiment. Method 700 includes forming a chip-carrier surface 104 for carrying a first chip 106 wherein the first chip 106 is configured to be in electrical connection with the chip-carrier surface 104 (in 710); and forming at least one cavity 114 extending into the chip-carrier 102 from the chip-carrier surface 104; wherein the at least one cavity 114 is configured to carry a second chip 116 wherein the second chip 116 is electrically insulated from the chip-carrier 102 (in 720).

Various embodiments provide improvements over current methods because the presence of unwanted glue on the chip top sides may be prevented. Adhesive material 124, e.g. an electrically insulating paste, e.g. an electrically insulating glue, may be used as an embedding material for chips, e.g. second chip 116. Increased isolation strength may be achieved due to chips, e.g. second chip 115, being electrically isolated using adhesive material 124, wherein adhesive material 124 electrically insulates chips, e.g. second chip 116 from the sides, e.g. the lateral sides. As a result, reliability of the housing may be increased and improved.

Various embodiments provide a chip-carrier including, a chip-carrier surface configured to carry a first chip from a first chip bottom side, wherein a first chip top side of the first chip is configured above the chip-carrier surface; and at least one cavity extending into the chip-carrier from the chip-carrier surface; wherein the at least one cavity is configured to carry a second chip from a second chip bottom side, wherein a second chip top side of the second chip is substantially level with the first chip top side.

According to an embodiment, a distance from the first chip bottom side to the first chip top side defines a first chip thickness; a distance from the second chip bottom side to the second chip top side defines a second chip thickness; and the second chip thickness is larger than the first chip thickness.

According to an embodiment, the first chip thickness ranges from about 50 µm to about 60 µm.

According to an embodiment, the second chip thickness ranges from about 100 µm to about 300 µm.

According to an embodiment, a depth of the at least one cavity extending into the chip-carrier from the chip-carrier surface is approximately equal to or more than a difference between the second chip thickness and the first chip thickness.

According to an embodiment, the chip-carrier includes an adhesive material formed over a bottom side of the cavity, wherein the second chip may be formed over the adhesive material.

According to an embodiment, the second chip bottom side is adhered to the bottom side of the cavity via the adhesive material.

According to an embodiment, the adhesive material is further configured to electrically isolate the second chip from one or more sides of the cavity.

According to an embodiment, the first chip includes a power semiconductor device, wherein the power semiconductor device includes at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

According to an embodiment, the second chip includes a semiconductor logic device or memory device, wherein the semiconductor logic device or memory device includes at least one semiconductor logic device or memory device from the group consisting of: an ASIC, a driver, a controller, a sensor.

According to an embodiment, the chip-carrier is configured to be in electrical connection with first chip bottom side.

According to an embodiment, the first chip and the second chip include a power-logic integrated circuit, the power-logic integrated circuit including a power semiconductor device and a semiconductor logic device.

According to an embodiment, the chip-carrier includes a leadframe.

According to an embodiment, the chip-carrier includes at least one from the following group of materials, the group of materials consisting of: copper, nickel, iron, copper alloy, nickel alloy, iron alloy.

Various embodiments provide a chip-package, the chip-package including a chip-carrier including, a chip-carrier surface configured to carry a first chip from a first chip bottom side, wherein a first chip top side of the first chip is configured above the chip-carrier surface; and at least one cavity extending into the chip-carrier from the chip-carrier surface; wherein the at least one cavity is configured to carry a second chip from a second chip bottom side, wherein a second chip top side of the second chip is substantially level with the first chip top side and an isolation material formed over the chip-carrier surface, wherein the isolation material is configured to partially surround the first chip, the second chip and the chip-carrier.

According to an embodiment, the isolation material is configured to surround the second chip on one or more sides of the second chip.

According to an embodiment, the isolation material is configured to surround the first chip on one or more sides of the first chip.

According to an embodiment, the isolation material is configured to electrically isolate the second chip from one or more sides of the cavity.

According to an embodiment, the isolation material is configured to electrically isolate one or more electrical contacts formed over first chip top side.

According to an embodiment, the isolation material is configured to electrically isolate one or more electrical contacts formed over second chip top side.

According to an embodiment, the isolation material includes at least one material from the following group of materials, the group consisting of: filled or unfilled epoxy, pre-impregnated composite fibers, laminate, a mold material, a thermoset material, a thermoplastic material.

According to an embodiment, the chip-package further includes an adhesive material formed over a bottom side of the cavity, wherein the adhesive material is further configured to electrically isolate the second chip from one or more sides of the cavity.

According to an embodiment, the adhesive material is configured to adhere the second chip bottom side to a bottom side of the cavity.

According to an embodiment, a distance from the first chip bottom side to the first chip top side defines a first chip thickness; a distance from the second chip bottom side to the second chip top side defines a second chip thickness; and the second chip thickness is larger than the first chip thickness.

According to an embodiment, the first chip thickness ranges from about 50 µm to about 60 µm.

According to an embodiment, the second chip thickness ranges from about 100 µm to about 300 µm.

According to an embodiment, a depth of the at least one cavity extending into the chip-carrier from the chip-carrier surface is approximately equal to or more than a difference between the second chip thickness and the first chip thickness.

According to an embodiment, the chip-carrier includes an adhesive material formed over a bottom side of the cavity, wherein the second chip may be formed over the adhesive material.

According to an embodiment, the second chip bottom side is adhered to the bottom side of the cavity via the adhesive material.

According to an embodiment, the adhesive material is further configured to electrically isolate the second chip from one or more sides of the cavity.

According to an embodiment, the first chip includes a power semiconductor device, wherein the power semiconductor device includes at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

According to an embodiment, the second chip includes a semiconductor logic device or memory device, wherein the semiconductor logic device or memory device includes at least one semiconductor logic device or memory device from the group consisting of: an ASIC, a driver, a controller, a sensor.

According to an embodiment, the chip-carrier is configured to be in electrical connection with first chip bottom side.

According to an embodiment, the first chip and the second chip include a power-logic integrated circuit, the power-logic integrated circuit including a power semiconductor device and a semiconductor logic device.

According to an embodiment, the chip-carrier includes a leadframe.

According to an embodiment, the chip-carrier includes at least one from the following group of materials, the group of materials consisting of: copper, nickel, iron, copper alloy, nickel alloy, iron alloy, aluminum and aluminum alloy.

Various embodiments provide a chip-carrier including: a chip-carrier surface configured to carry a first chip wherein the first chip is configured to be in electrical connection with the chip-carrier surface; and at least one cavity extending into the chip-carrier from the chip-carrier surface; wherein the at least one cavity is configured to carry a second chip wherein the second chip is electrically insulated from the chip-carrier.

Various embodiments provide a method for forming a chip-carrier, the method including forming a chip-carrier surface for carrying a first chip from a first chip bottom side, wherein a first chip top side of the first chip is configured above the chip-carrier surface; and forming at least one cavity extending into the chip-carrier from the chip-carrier surface; wherein the at least one cavity is for carrying a second chip from a second chip bottom side, wherein a second chip top side of the second chip is substantially level with the first chip top side.

Various embodiments provide a method for forming a chip package, the method including forming a chip-carrier surface for carrying a first chip from a first chip bottom side, wherein a first chip top side of the first chip is configured above the chip-carrier surface;

forming at least one cavity extending into the chip-carrier from the chip-carrier surface; wherein the at least one cavity is for carrying a second chip from a second chip bottom side, wherein a second chip top side of the second chip is substantially level with the first chip top side; and forming an isolation material over the chip-carrier surface for partially surrounding the first chip, the second chip and the chip-carrier.

Various embodiments provide a method for forming a chip-carrier, the method including forming a chip-carrier surface for carrying a first chip wherein the first chip is configured to be in electrical connection with the chip-carrier surface; and forming at least one cavity extending into the chip-carrier from the chip-carrier surface; wherein the at least one cavity is configured to carry a second chip wherein the second chip is electrically insulated from the chip-carrier.

Various embodiments provide a special leadframe design reliably built, and when combined with a glue-embedding process, results in chips with different heights being formed over a side of a leadframe, such that the top surfaces of the chips may be at the same level.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip-package comprising:
a first chip;
a second chip; and
a chip-carrier, wherein the chip-carrier comprises
a chip-carrier surface configured to carry the first chip from a first chip bottom side, wherein a first chip top side of the first chip is configured above the chip-carrier surface; and
at least one cavity extending into the chip-carrier from the chip-carrier surface,
wherein the at least one cavity is configured to carry the second chip from a second chip bottom side, wherein a second chip top side of the second chip is substantially level with the first chip top side,
wherein a distance from the first chip bottom side to the first chip top side defines a first chip thickness,
wherein a distance from the second chip bottom side to the second chip top side defines a second chip thickness, and
wherein the second chip thickness is larger than the first chip thickness.

2. The chip-package according to claim 1, wherein the first chip thickness ranges from about 20 µm to about 150 µm.

3. The chip-package according to claim 1, wherein the second chip thickness ranges from about 100 µm to about 400 µm.

4. The chip-package according to claim 1, wherein a depth of the at least one cavity extending into the chip-carrier from the chip-carrier surface is approximately equal to or more than a difference between the second chip thickness and the first chip thickness.

5. The chip-package according to claim 1, comprising: an adhesive material formed over a bottom side of the cavity, wherein the second chip may be formed over the adhesive material.

6. The chip-package according to claim 5, wherein the second chip bottom side is adhered to the bottom side of the cavity via the adhesive material.

7. The chip-package according to claim 5, wherein the adhesive material is further configured to electrically isolate the second chip from one or more sides of the cavity.

8. The chip-package according to claim 1, wherein the first chip comprises a power semiconductor device, wherein the power semiconductor device comprises at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power Schottky diode, a silicon carbide diode, a gallium nitride device.

9. The chip-package according to claim 1, wherein the second chip comprises a semiconductor logic device or memory device, wherein the semiconductor logic device or memory device comprises at least one semiconductor logic device or memory device from the group consisting of: an ASIC, a driver, a controller, a sensor.

10. The chip-package according to claim 1, wherein the chip-carrier is configured to be in electrical connection with first chip bottom side.

11. The chip-package according to claim 1, wherein the first chip and the second chip comprise a power-logic integrated circuit, the power-logic integrated circuit comprising a power semiconductor device and a semiconductor logic device.

12. The chip-package according to claim 1, wherein the chip-carrier comprises a leadframe.

13. The chip-package according to claim 1, wherein the chip-carrier comprises at least one from the following group of materials, the group of materials consisting of: copper, nickel, iron, copper alloy, nickel alloy, iron alloy, aluminum, aluminum alloy.

14. The chip-package according to claim 1, further comprising an isolation material formed over the chip-carrier surface, wherein the isolation material is configured to partially surround the first chip, the second chip and the chip-carrier.

15. The chip-package according to claim 14, wherein the isolation material is configured to electrically isolate the second chip from one or more sides of the cavity.

16. The chip-package according to claim 14, wherein the isolation material is configured to electrically isolate one or more electrical interconnects formed over first chip top side.

17. The chip-package according to claim 14, wherein the isolation material is configured to electrically isolate one or more electrical contacts formed over second chip top side.

18. The chip-package according to claim 14, wherein the isolation material comprises at least one material from the following group of materials, the group consisting of: filled or unfilled epoxy, pre-impregnated composite fibers, laminate, a mold material, a thermoset material, a thermoplastic material.

19. The chip-package according to claim 14, further comprising:
an adhesive material formed over a bottom side of the cavity, wherein the adhesive material is further configured to electrically isolate the second chip from one or more sides of the cavity.

20. The chip-package according to claim 19, wherein the adhesive material is configured to adhere the second chip bottom side to a bottom side of the cavity.

21. A method for forming a chip-package, the method comprising:
carrying a first chip from a first chip bottom side by a chip-carrier surface, wherein a first chip top side of the first chip is configured above the chip-carrier surface;
forming at least one cavity extending into the chip-carrier from the chip-carrier surface; and
carrying a second chip from a second chip bottom side by the at least one cavity, wherein a second chip top side of the second chip is substantially level with the first chip top side,
wherein a distance from the first chip bottom side to the first chip top side defines a first chip thickness,
wherein a distance from the second chip bottom side to the second chip top side defines a second chip thickness, and
wherein the second chip thickness is larger than the first chip thickness.

22. The method according to claim 21, further comprising forming an isolation material over the chip-carrier surface for partially surrounding the first chip, the second chip and the chip-carrier.

23. A chip-package comprising:
a first chip;
a second chip; and
a chip-carrier, wherein the chip-carrier comprises
a chip-carrier surface configured to carry the first chip, wherein the first chip is configured to be in electrical connection with the chip-carrier surface; and
at least one cavity extending into the chip-carrier from the chip-carrier surface, wherein the at least one cavity is configured to carry the second chip, wherein the second chip is electrically insulated from the chip-carrier, and
wherein the second chip has a thickness larger than a thickness of the first chip.

24. A method for forming a chip-package, the method comprising:
carrying a first chip by a chip-carrier surface, wherein the first chip is configured to be in electrical connection with the chip-carrier surface; and
carrying a second chip by at least one cavity extending into the chip-carrier from the chip-carrier surface, wherein the second chip is electrically insulated from the chip carrier, and
wherein the second chip has a thickness larger than a thickness of the first chip.

* * * * *